(12) United States Patent
Luttrull

(10) Patent No.: US 6,534,181 B2
(45) Date of Patent: Mar. 18, 2003

(54) STYRENE-MALEIC ANHYDRIDE COPOLYMER AND EPOXY RESIN BLEND CROSSLINKED WITH MULTIFUNCTIONAL AMINE COMPOUNDS

(75) Inventor: David K. Luttrull, Phoenix, AZ (US)

(73) Assignee: Neltec, Inc., Tempe, AZ (US)

( * ) Notice: Subject to any disclaimer, the term of this patent is extended or adjusted under 35 U.S.C. 154(b) by 17 days.

(21) Appl. No.: 09/818,028

(22) Filed: Mar. 27, 2001

(65) Prior Publication Data

US 2002/0006515 A1 Jan. 17, 2002

Related U.S. Application Data

(60) Provisional application No. 60/192,269, filed on Mar. 27, 2000.

(51) Int. Cl.[7] .............................................. B32B 27/38
(52) U.S. Cl. ........................ 428/416; 428/901; 428/413; 525/449; 525/526; 525/528; 528/73
(58) Field of Search .................. 428/416, 901; 525/449, 526, 528; 528/73

(56) References Cited

U.S. PATENT DOCUMENTS

| 4,460,718 A | | 7/1984 | Tanaka et al. |
|---|---|---|---|
| 4,859,122 A | | 8/1989 | Shiobara et al. |
| 5,508,328 A | | 4/1996 | Olson |
| 5,620,831 A | | 4/1997 | Kawana |
| 5,646,240 A | * | 7/1997 | Oishi et al. .................. 528/403 |
| 5,700,607 A | | 12/1997 | Rath et al. |
| 6,005,052 A | * | 12/1999 | Venkataswamy et al. ... 525/166 |
| 6,333,064 B1 | * | 12/2001 | Gan ............................ 427/58 |

* cited by examiner

*Primary Examiner*—Robert Dawson
*Assistant Examiner*—Christopher M. Keehan
(74) *Attorney, Agent, or Firm*—McGarry Bair PC

(57) ABSTRACT

A resin blend that includes a copolymer of styrene and maleic anhydride (SMA), an epoxy resin (brominated, phosphonated, or bromine-free), and a multifunctional amine cross-linking agent is disclosed. The cross-linking agent generally contains at least two primary amino groups to promote formation of imide functionalities upon reaction with the anhydride moieties of the SMA copolymer. Particularly useful cross-linking agents include triazine-centered diamino and triamino compounds such as benzoguanamine, acetoguanamine, and melamine. The disclosed resin blend finds use as a polymer matrix in composite materials and as an impregnating resin in laminates. Compared to conventional SMA copolymer/epoxy resin blends, the disclosed resin exhibits lower dielectric constant and dissipation factor, as well as higher thermal and moisture resistance, making it especially useful in high-speed, low-loss printed wire board applications.

21 Claims, No Drawings

STYRENE-MALEIC ANHYDRIDE COPOLYMER AND EPOXY RESIN BLEND CROSSLINKED WITH MULTIFUNCTIONAL AMINE COMPOUNDS

CROSS-REFERENCE TO RELATED APPLICATION

This application claims the benefit of U.S. Provisional Applicatin No. 60/192,269, filed on Mar. 27, 2000.

BACKGROUND

1. Technical Field

The invention relates to blends of epoxy resins and copolymers of styrene and maleic anhydride. In one of its aspects, the invention relates to blends of epoxy resins that can serve as polymer matrices in composite materials and laminates such as multi-layer printed circuit boards and communications antennae.

2. Discussion

Multilayer printed circuits find use in a variety of electronic applications. For example, they furnish structure for mounting semiconductor components, and provide the primary interconnection between discrete components in most computing systems such as desktop and laptop computers. These circuits continue to evolve in complexity and density as semiconductors and systems become more complex. More advanced multilayer printed circuits are referred to as Multichip Modules, High Density Interconnects, Micro Via Multilayers, and PCMCIAs.

Copper clad laminates provide the electrical insulation and the physical structure for each of the individual circuit layers of a multilayer printed circuit. In some cases, the copper clad laminates themselves function as application components, such as passive capacitors, as in ZYCON BURIED CAPACITANCE™ technology, for example. Conventional copper clad laminates are comprised of three main components—copper foil, thermosetting resin, and woven or non-woven fabric reinforcement. Generally, the copper foil is about 35 microns thick and is made by an electrodeposition process. Often, one or both sides of the copper foil are treated to improve adhesion to the fabric reinforced thermosetting resin.

A conventional copper clad laminate is typically manufactured using a three-step process. In a first step, a woven fabric is coated or impregnated with a thermosetting resin, forming what is known as a prepreg. To improve handling and bonding, the prepreg is usually partially cured—or B-staged. In a second step, the prepreg is interposed between two copper foils, and in a third and final step, the prepreg and the copper foils are bonded together with heat and pressure to form the copper clad laminate.

Typically, epoxy resins are employed as the thermosetting resin in copper clad laminates. Epoxy resins offer many advantages over competing systems, including low cost, relatively high glass transition temperature, Tg, and well understood cure chemistry. However, in certain high frequency applications (greater than one MHz, for instance), the use of epoxy resins leads to unacceptable signal loss because of their relatively high dielectric constant, $D_k$, and dissipation factor, $D_f$. Furthermore, many epoxy resin systems—notably those cured with dicyandiamide—exhibit moisture and heat sensitivity. Such epoxy resin systems often cannot withstand the higher temperatures and longer residence times associated with lead-free soldering processes.

SUMMARY OF THE INVENTION

The invention provides a resin blend that possesses many of the advantages of epoxy resins, but also exhibits lower dielectric constant and dissipation factor, and improved moisture and thermal resistance. The resin blend includes a copolymer of styrene and maleic anhydride (SMA), an epoxy resin, and a multifunctional amine cross-linking agent. The cross-linking agent generally contains at least two primary amino groups to promote formation of imide functionalities upon reaction with the anhydride moieties of the SMA copolymer. Generally, the epoxy resin can be a brominated or a phosphonated resin. In a preferred embodiment, the epoxy resin is a brominated resin, the SMA resin has a 4 to 1 weight ratio of styrene to maleic anhydride, and the cross-linking agent is 2,4-diamino-6-phenyl-s-triazine. The resin blend can be used as a polymer matrix in composite materials, as an impregnating resin in prepreg and as an impregnating resin in metal clad laminates. Compared to conventional SMA copolymer/epoxy resin blends, the resin blend according to the invention exhibits higher thermal and moisture resistance and lower dielectric constant and dissipation factor, making it especially useful in lead-free soldering and high-speed, low-loss printed wire board applications.

DETAILED DESCRIPTION OF THE PREFERRED EMBODIMENTS

The invention relates to blends of epoxy resins and copolymers of styrene and maleic anhydride (SMA) that are cross-linked with multifunctional amine compounds. The blends can serve as polymer matrices in composite materials and laminates. Compared to conventional SMA copolymer/epoxy resin blends, the disclosed resin system exhibits higher thermal and moisture resistance and lower dielectric constant and dissipation factor, making it especially useful as an impregnating resin in high-speed, low-loss printed circuit boards. In addition, the disclosed resin system should be more robust than conventional epoxy resins in lead-free soldering processes in the manufacture of printed circuit and wire boards, which require high temperatures and long residence times (see Table 2 for Solder Float @ 300° C. and T300 tests).

The resin blend generally comprises about 10 to 90 wt % SMA copolymer, about 90 to 10 wt % epoxy resin, and about 1 to 10 wt % multifunctional amine cross-linking agent. When cured, the SMA copolymer produces a rigid, low dielectric material with superior thermal stability and moisture resistance. SMA copolymer is commercially available in a broad range of molecular weights and monomer weight ratios. Typically, the molecular weight of the SMA copolymer can range from about 1400 to about 10000 (weight average molecular weight), and the weight ratio of styrene monomer to maleic anhydride can range from about 1:1 to about 8:1.

The epoxy resin component of the blend is included, in part, to reduce brittleness of the cured resin system. Epoxy resins are characterized by the presence of a three-member ring known as an epoxy, epoxide, oxirane, or ethyoxyline group. The disclosed resin blend can employ any number of epoxy resins used in the manufacture of composite materials and laminates. Examples of useful epoxy resins include diglycidyl ethers of bisphenol A, bisphenol F, aliphatic glycols, novolacs or other polyols; multifunctional cresol-novolac resins; epoxy phenol novolac resins; polynuclear phenol-glycidyl ether-derived resins; cycloaliphatic epoxy resins; and aromatic and heterocyclic glycidyl amine resins.

The latter resins include tetraglycidylmethylenedianiline-derived resins, triglycidyl p-aminophenol-derived resins, and triazine-based resins such as triglycidyl isocyanurate. In printed circuit board applications, one or more of the epoxy resins are typically brominated and/or phosphonated.

An important feature of the curing system is the formation of thermally stable imide groups. Hence, the multifunctional amine cross-linking agent or agents ordinarily include at least two primary amino groups, which promotes the formation of substituted-succinimide functional groups upon reaction of the cross-linking agent with anhydride moieties of the SMA copolymer. Thus, the cross-linking agent can be generally represented by the formula:

   I

In formula I, n is an integer greater than or equal to two and $R_1$ is aliphatic, alicyclic, aromatic, and arylalkyl, and can contain heteroatoms such as oxygen and nitrogen.

Because of their thermal stability, triazine-centered multifunctional amines are especially useful cross-linking agents and can be represented by the formula:

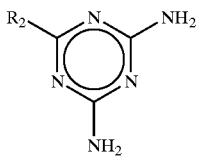   II

In formula II, $R_2$ is aliphatic, alicyclic, aromatic, arylalkyl, or hydrogen, and can contain heteroatoms such as oxygen and nitrogen. Particularly useful examples of cross-linking agents represented by formula II include benzoguanamine (2,4 diamino-6-phenyl-s-triazine); alkyl guanamines such as acetoguanamine; imidizole-substituted guanamines; and melamine (2,4,6 triamino-s-triazine). Other useful multifunctional amines include derivatives of dianiline having the formula:

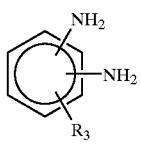   III where, $R_3$ is aliphatic, alicyclic, aromatic, arylalkyl, or hydrogen, and can contain heteroatoms such as oxygen and nitrogen. Examples of cross-linking agents represented by formula III include alkylene dianilines such as methylene dianiline, and phenylene ether dianilines.

During cure, the amino groups will react with the anhydride moieties of the SMA copolymer as well as the oxirane groups of the epoxy resin. In addition, the anhydride moieties of the SMA copolymer, as well as residual hydroxyl groups of the epoxy resin (and phenolic hydroxyl groups of any novolac resin present in the blend), will react with the oxirane groups forming a complex polymer network. However, the reaction between the amino groups and the anhydride groups should predominate, ensuring formation of imide groups in the polymer network. To achieve good prepreg and varnish shelf life and to maintain good mechanical and hydrophobic properties, the ratio of molar equivalents of anhydride to amino groups should range from about one to about five, depending on the amount of epoxy (molar equivalents) in the resin blend. Excess anhydride reacts with the oxirane groups of the epoxy resin to provide good laminate properties.

In manufacturing composite materials and laminates, the uncured resin system typically includes diluents or solvents to reduce the viscosity of the resin blend. One may employ any number of solvents generally used with epoxy resin systems, as long the solvents are compatible with the SMA copolymer and the multifunctional amine cross-linking agent. An especially useful solvent system includes γ-butyrolactone (GBL), propylene glycol-methoxy ether acetate (PMA), and methyl ethyl ketone (MEK) combined in about a 9:5:1 weight ratio.

In addition to diluents that aid processing, laminates such as printed circuit boards typically include reinforcement fillers. Thus, the disclosed SMA copolymer and epoxy resin blend will generally include solid fillers. Useful fillers include talc, mica, clay, silica, $TiO_2$, $BaTiO_3$, boron nitride, glass fiber, aramid fiber, polyphenylene oxide (PPO), and thermoplastics, among others.

EXAMPLES

The following examples illustrate non-limiting, specific embodiments of the present invention.

Example 1: SMA-Epoxy Varnish

Table 1 lists components of a prepreg composition that includes a blend of a brominated epoxy-novolac resin, a styrene-maleic anhydride (SMA) copolymer, and a diamino cross-linking agent (benzoguanamine). Benzoguanamine (2,4-diamino-6-phenyl-s-triazine) is added to a solvent mixture of γ-butyrolactone (GBL), propylene glycol-methoxy ether acetate (PMA), and methyl ethyl ketone (MEK). The mixture is agitated with an overhead stirrer and the temperature is raised slowly to 70° C. The mixture is stirred until clear, which indicates that the benzoguanamine is completely dissolved. The temperature of the mixture is reduced to 30° C., and the SMA copolymer, which has a four-to-one weight ratio of styrene to maleic anhydride, is slowly added with continuous stirring. Once the SMA copolymer resin is completely dissolved, components of the brominated epoxy resin are added resulting in a varnish viscosity of about 200±30 cps at 23° C. and a gel time between about 160 and 200 seconds at 170° C.

TABLE 1

SMA-Epoxy Varnish Composition

| Component | Trade Designation | Supplier | Amount, g |
|---|---|---|---|
| GBL | | | 210 |
| PMA | | | 120 |
| MEK | | | 25 |
| Benzoguanamine | | | 15 |
| SMA | EF40 | Elf Atochem | 230 |
| Brominated Epoxy | DER 560 | Dow Chemical | 100 |
| Multifunctional Epoxy | DER 592 | Dow Chemical | 125 |
| Difunctional Epoxy | DER 538 | Dow Chemical | 125 |

Example 2: Fiberglass Reinforced Prepreg

A SMA-epoxy varnish as described in Example 1 is used to prepare a fiberglass reinforced prepreg. Woven fiberglass fabric (7628 style E-Glass, which is available from Hexcell-Schwebel, JPS, BGF, Asahi-Schwebel, Nittobo, and NE-Glass) is cut into rectangular panels (13 inch-by-30 inch). Each fabric panel is immersed in the varnish and is pulled through a narrow gap between a pair of pinch bars (two parallel stainless steel rods) to eliminate excess resin. The gap between the stainless steel rods is typically about 0.013 inches, which generally results in a prepreg having a resin content within a target range of about 40 to 44 weight percent resin. Following immersion in the varnish and subsequent removal of excess resin, each prepreg is immediately placed in a well-ventilated oven at 170° C. for about three-and-a-half minutes. After removal from the oven, the each prepreg is suspended in a fume hood to cool. Once cooled, each prepreg is weighed to calculate resin content, which can be increased or decreased by, respectively, widening or narrowing the gap between the pinch bars or by lowering or raising the fraction of solids in the varnish. To check cure chemistry, the melt viscosity of residual solid SMA-epoxy resin is also measured. Generally, the cured resin exhibits a melt viscosity in a range of about 1.5 to 2.5 kPa·S at 170° C.

Example 3: Copper Clad Laminates

Prepreg as described in Example 2 is used to prepare copper clad laminates. Each prepreg is cut into 12 inch-square sheets and eight of the sheets are stacked between two, 12 inch-square, one-ounce copper sheets. As in conventional printed circuit board manufacturing, the surfaces of each copper sheet in contact with the prepreg stack are treated prior to lamination to improve adhesion between the copper and the fiberglass-reinforced prepreg. The eight-ply prepreg—sandwiched between the copper sheets—is then interposed between two stainless steel plates and the resulting assembly is placed between the platens of a vacuum press. Ten sheets of craft paper are placed between the external surfaces of the stainless steel plates and the temperature-controlled platens to reduce the rate of heat transfer between the stainless steel plates and the platens. Prior to lamination, the volume surrounding the platens and the prepreg assembly is evacuated to about 25 mm Hg absolute pressure, and the platens are ramped to a temperature of about 195° C. Next, the platens apply a 285-psi compressive force for about 90 minutes, which is sufficient to bond together the prepreg plies and copper sheets and to completely cure the resin. During the compression cycle, the platens maintain the temperature of the laminate at about 195° C. to complete the curing process, and the press sustains a vacuum of about 25 mm Hg to purge the system of any gas evolved during the cure. Following compression, the laminate is allowed to cool to 120° C. and is removed from the press. When cooled, the resulting copper clad laminate is trimmed and can be etched using conventional photo resist techniques if required for testing.

Table 2 lists various electrical and mechanical properties of copper clad laminates made in accordance with Example 1–3. In addition, Table 2 lists electrical and mechanical properties of unclad laminates having different weight percent resin content (RC).

TABLE 2

Comparison of copper clad laminates made with a SMA-Epoxy blend and a conventional epoxy

| Test | Parameters | Sample | Test Method | Example 1–3 |
| --- | --- | --- | --- | --- |
| Tg | DMTA | Etched (Unclad) | Tan δ peak Rheometrics | 198 |
| | DSC | Cu Clad | DSC@10° C./min | 180 |
| | TMA | Cu Clad | TMA @10° C./min | 165 |
| | Z-CTE | Cu Clad | to 260° C. | 3.3 |
| | Z-CTE | Cu Clad | to 288° C. | 4.6 |
| T260 (TMA, 300° C.) | minutes to delaminate | Cu Clad | IPC-TM-650 | 30+ |
| T300 (TMA, 300° C.) | minutes to delaminate | Cu Clad | N/A | 3.5 |
| TGA (° C. at 5% weight loss) | | N/A | N/A | 347 |
| Z CTE (TMA) | ppm/° C. | Cu Clad | 50° C. to 175° C. 175° C. to 260° C. | 88, 235 |
| Water Absorption | 24 hr, ambient T | | IPC-TM-650, Max | 0.10% |
| Dielectric Constant, $D_k$ | 1 MHz | 43% RC | IPC-TM-650 | 4.1 |
| | 1 GHz | 43% RC | HP4291A Unit | 4.0 |
| | 1 GHz | 62% RC | HP4291A Unit | 3.6 |
| | 10 GHz | 62% RC | IPC-TM-650 2.5.5.5 (Stripline) | 3.4 |
| Dissipation Factor, $D_f$ | 1 MHz | 60% RC | IPC-TM-650 | 0.010 |
| | 1 GHz | 43% RC | HP4291A Unit | 0.011 |
| | 1 GHz | 62% RC | HP4291A Unit | 0.010 |
| | 10 GHz | 62% RC | IPC-TM-650 2.5.5.5 (Stripline) | 0.010 |
| Pressure Cooker | 60 min@15 psi | 3" × 3" etched | Water % gain | 0.16% |
| Solder Dip @288° C. | | 3" × 3" etched | N/A | 600+ |
| Solder Dip @300° C. | | 3" × 3" etched | N/A | 225 |
| Solder Float to Blister | 288° C. | 4" × 4" Cu clad | | 402 |
| Cure Time/Press Cycle | 90 minutes @ 380° F., 10° F./min Heat Rise | | | |
| Copper Peel Strengths (Lbs./in) | WG | 1 Oz. Copper | | 7.5 |
| | XG | 1 Oz. Copper | | 7.5 |
| Oxide-DMAB | | | | 4.3 |
| Oxide-Alternative | | | | 3.8 |
| Inner-laminar bond strength (ILBS) | WG | 1 Oz. Copper | | 6.5 |
| ILBS | XG | 1 Oz. Copper | | 7.7 |
| Rheology: prepreg | MV, Stroke, Gel | | | 2.0/380/200 |

TABLE 2-continued

Comparison of copper clad laminates made with a SMA-Epoxy blend and a conventional epoxy

| Test | Parameters | Sample | Test Method | Example 1–3 |
|---|---|---|---|---|
| G' (maximum elastic modulus) | | | | 50000 |
| Baking/Staining | 1 Hour @ 200° C. With CuO traces | 1 Oz Copper | N/A | No Staining from Baking |
| Chemical Resistance | Methylene Chloride | 2" × 2" | IPC TM 650, MAX | 1.00% |
| | DMF | 2" × 2" | IPC TM 650 | 0.05% |

DMTA: Dynamic Mechanical Thermal Analyzer
DSC: Differential Scanning Calorimetry
TMA: Thermomechanical Analysis
TGA: Thermogravimetric Analysis
Z-CTE: coefficient of thermal expansion in the Z-axis
IPC-TM-650: FR4 laminate test methods
HP4291A: RF impedance measurement
XG: cross grain, fill direction of fabric weave
WG: with grain, warp direction of fabric weave
MV: melt viscosity
DMF: Dimethylformamide
ILBS: inner-laminar bond strength
DMAB: Dimethylamine borane It is to be understood that the above description is intended to be illustrative and not limiting. Many embodiments will be apparent to those of skill in the art upon reading the above description. Therefore, the scope of the invention should be determined, not with reference to the above description, but instead with reference to the appended claims, along with the full scope of equivalents to which such claims are entitled. The disclosures of all articles and references, including patent applications and publications are incorporated herein by reference for all purposes.

What is claimed is:

1. A resin composition comprising:

a blend of an epoxy resin with a copolymer of styrene and maleic anhydride (SMA) having substituted-succinimide functional groups formed by the reaction of anhydride moieties of the SMA copolymer with a cross-linking agent having at least two primary amino groups.

2. The resin composition of claim 1 wherein the epoxy resin is a diglycidyl ether of bisphenol A, a bisphenol F resin, an aliphatic glycol resin, or a novolac resin.

3. The resin composition of claim 2 wherein the epoxy resin is a brominated or a phosphonated resin.

4. The resin composition of claim 1 wherein the epoxy resin is a brominated or a phosphonated resin.

5. The resin composition of claim 1 wherein the epoxy is a multifunctional cresol-novolac resin, an epoxy phenol novolac resin, a polynuclear phenol-glycidyl ether resin, a cycloaliphatic epoxy resin, an aromatic glycidyl amine resin, or a heterocyclic amine ether resin.

6. The resin composition of claim 1 wherein the epoxy resin is a tetraglycidylmethylenedianiline resin, a triglycidyl p-amino phenol resin, or a triazine resin.

7. The resin composition of claim 1 wherein the cross-linking agent is $R_1(NH_2)_n$,

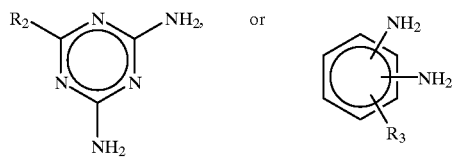

wherein n is an integer greater than or equal to 2 and $R_1$, $R_2$ and $R_3$ are aliphatic, alicyclic, aromatic, arylalkyl, heteroaliphatic or heterocyclic.

8. The resin composition of claim 7 wherein the cross-linking agent is arylguanamine, alkyl guanamine, imidizole-substituted guanamine, or melamine.

9. The resin composition of claim 7 wherein the cross-linking agent is alkylene dianiline or phenylene ether dianiline.

10. The resin composition of claim 1 which includes 10–90 weight % of the epoxy resin, 90-10 weight % of the SMA resin, and 1–10 weight % of the cross-linking agent.

11. The resin composition of claim 1 further comprises a diluent, a solvent, a filler, a reinforcement, or combinations thereof.

12. The resin composition of claim 11 wherein the solvent includes γ-butyrolactone, propylene glycol-methoxy ether acetate and methyl ethyl ketone in 9:5:1 weight ratio.

13. The resin composition of claim 1 wherein the epoxy resin is a brominated resin, the SMA resin has a 4 to 1 weight ratio of styrene to maleic anhydride, and the cross-linking agent is 2,4-diamino-6-phenyl-s-triazine.

14. A prepreg comprising:
a woven fabric impregnated with a resin composition comprising a blend of an epoxy resin and a SMA resin, wherein the SMA resin includes substituted-succinimide functional groups formed by the reaction of anhydride moieties of the SMA resin with a cross-linking agent having at least two primary amino groups.

15. A laminate comprising:
a) a substrate including
a resin composition comprising a blend of an epoxy resin and a SMA resin, wherein the SMA resin includes substituted-succinimide functional groups formed by the reaction of anhydride moieties of the SMA resin with a cross-linking agent having at least two primary amino groups; and b) a layer of metal disposed on at least one surface of said substrate.

16. The laminate of claim 15 wherein the substrate further comprises a diluent, a solvent, a filler, a reinforcement, or combinations thereof.

17. The laminate of claim 16 wherein the substrate further comprises a reinforcement of a woven glass fabric, wherein the epoxy resin, the SMA resin and the cross-linking agent are impregnated on the woven glass fabric.

18. The laminate of claim 15 wherein the epoxy resin is a brominated or a phosphonated resin.

19. The laminate of claim 15 wherein the epoxy resin is a brominated resin, the SMA resin has a 4 to 1 weight ratio of styrene to maleic anhydride, and the cross-linking agent is 2,4-diamino-6-phenyl-s-triazine.

20. The laminate of claim 15 wherein the substrate includes 10–90% weight % of the epoxy resin, 10–90 weight % of the SMA resin, and 1–10 weight % of the cross-linking agent.

21. The laminate of claim 15 wherein the cross-linking agent is $R_1(NH_2)_n$,

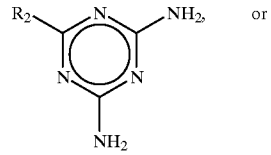

wherein n is an integer greater than or equal to 2 and $R_1$, $R_2$ and $R_3$ are aliphatic, alicyclic, aromatic, arylalkyl, heteroaliphatic or heterocyclic.

* * * * *